(12) United States Patent
Quinlan

(10) Patent No.: US 11,101,653 B2
(45) Date of Patent: Aug. 24, 2021

(54) SOLAR GENERATION ESTIMATION

(71) Applicant: S&C Electric Company, Chicago, IL (US)

(72) Inventor: Michael Quinlan, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 266 days.

(21) Appl. No.: 16/551,814

(22) Filed: Aug. 27, 2019

(65) Prior Publication Data

US 2020/0287384 A1 Sep. 10, 2020

Related U.S. Application Data

(60) Provisional application No. 62/743,186, filed on Oct. 9, 2018.

(51) Int. Cl.
| | |
|---|---|
| *H02J 3/00* | (2006.01) |
| *H02J 3/38* | (2006.01) |
| *G01R 22/10* | (2006.01) |
| *G05B 17/02* | (2006.01) |
| *G01J 1/44* | (2006.01) |
| *G01J 1/42* | (2006.01) |

(52) U.S. Cl.
CPC ............ *H02J 3/004* (2020.01); *G01J 1/44* (2013.01); *G01R 22/10* (2013.01); *G05B 17/02* (2013.01); *H02J 3/381* (2013.01); *G01J 2001/4276* (2013.01); *H02J 2300/24* (2020.01)

(58) Field of Classification Search
CPC ........ H02J 3/004; H02J 3/381; H02J 2300/24; G01J 1/44; G01J 2001/4276; G01J 1/0228; G01R 22/10; G05B 17/02; Y02B 70/3225; Y04S 10/50; Y04S 20/222; Y02E 10/56

See application file for complete search history.

(56) References Cited

U.S. PATENT DOCUMENTS

| | | | | |
|---|---|---|---|---|
| 9,112,078 | B2 * | 8/2015 | Klein | ............... H02S 50/00 |
| 9,535,135 | B2 * | 1/2017 | Fujimori | ............. G01R 31/69 |
| 9,645,180 | B1 * | 5/2017 | Hoff | ............... G01W 1/12 |
| 10,211,777 | B2 * | 2/2019 | Watanabe | .............. H02J 3/383 |
| 10,309,994 | B2 * | 6/2019 | Hoff | ............... G01W 1/02 |
| 10,663,500 | B2 * | 5/2020 | Hoff | ............ G01R 21/1331 |
| 11,016,130 | B2 * | 5/2021 | Hoff | .............. G06F 30/20 |
| 2011/0307199 | A1 * | 12/2011 | Klein | ............... H02S 50/00 |
| | | | | 702/60 |
| 2014/0136131 | A1 * | 5/2014 | Fujimori | ................ H02S 50/10 |
| | | | | 702/60 |
| 2014/0188410 | A1 * | 7/2014 | Kerrigan | ............... G01R 21/00 |
| | | | | 702/61 |

(Continued)

*Primary Examiner* — Charles R Kasenge

(57) ABSTRACT

A method for estimating an amount of solar generation capacity on a portion of the electrical grid such as a feeder. The method calculates maximum irradiance conditions for the feeder's geographic location and the time of year, and also records actual changes in electrical load measured periodically at a source over a time span such as a month. An additional analysis of active power against reactive power on the feeder is used to identify changes in load which were driven by real consumption versus those driven by changes in solar generation. A comparison of the actual changes in electrical load due to solar generation variation to the maximum irradiance curve yields a scaling factor and provides an estimate of the solar generation capacity on the feeder.

20 Claims, 4 Drawing Sheets

(56) References Cited

U.S. PATENT DOCUMENTS

2015/0013748 A1* 1/2015 Garabandic ............... G05F 1/67
　　　　　　　　　　　　　　　　　　　　　　　136/244
2017/0012580 A1* 1/2017 Watanabe ............... H02J 3/383
2017/0228834 A1* 8/2017 Hoff ........................ G01W 1/10

* cited by examiner

SOLAR GENERATION ESTIMATION

CROSS-REFERENCE TO RELATED APPLICATION

This application claims the benefit of priority from the U.S. Provisional Application No. 62/743,186, filed on Oct. 9, 2018, the disclosure of which is hereby expressly incorporated herein by reference for all purposes.

BACKGROUND

Field

The present disclosure relates generally to a method of estimating solar generation capacity on an electrical grid. More particularly, it relates to a method of estimating an amount of solar generation capacity on a portion of the distribution grid such as a feeder.

Discussion of the Related Art

An electrical power transmission/distribution network, often referred to as an electrical grid, typically includes a number of power generation plants each including a number of power generator units, such as gas turbine engines, nuclear reactors, coal-fired generators, hydro-electric dams, etc. The grid may also include wind and/or solar energy generation installations. Not only are there many different types of energy generators on the grid, but there are also many different types of loads, and the generators and loads are distributed over large geographic areas. The transmission grid carries electricity from the power plants over long distances at high voltages. The distribution grid, separated from the transmission grid by voltage-reducing substations, provides electricity to the consumers/loads.

The distribution grid is divided into many sub-elements commonly known as feeders, which are connected to a primary source (i.e., substation) at one end, with many consumers (residences and businesses) connected along the length of the feeder. In recent years, there has been a rapid increase in distributed solar generation, meaning solar generation installed at individual homes and businesses. Distributed solar generation can not only meet a large part of the energy requirements of the home or business, but can even provide excess generation power back to the distribution grid under favorable solar conditions. Solar generation, specifically photovoltaic (PV) panels, are a highly variable form of electric generation. This variability in power production makes it difficult to manage and operate a reliable grid where PV penetration is high.

Because of the growing amount of solar generation capacity and the rapidly-varying impact it can have on the requirement for traditional generation capacity (provided by nuclear reactors, gas- or coal-fired generators, hydro-electric, etc.), it is important that electrical utilities, generators and transmission companies know how much solar generation capacity exists on the distribution grid.

In the case of large solar generation plants which contain a large, concentrated number of PV panels, a utility will have intimate knowledge of the generation capacity of the plant. They may also install a measurement system to actively monitor the production of the plant in real time. On the other hand, a single solar panel, of the type installed at a private residence or small business, is typically not large enough on its own to have a noticeable effect on a distribution grid, therefore it is unlikely a utility would monitor or even record an installation of an individual PV panel. However, as the number of installations grows, the aggregated effect of the PV panels can cause large fluctuations in resources on a network.

In view of the circumstances described above, there is a need for a method of estimating the amount of solar generation capacity on a portion of the electrical grid which does not rely on individual PV panels being monitored, or their existence even being recorded.

SUMMARY

The present disclosure describes a method of estimating an amount of solar generation capacity on a portion of the electrical grid such as a feeder. The method calculates maximum irradiance conditions for the feeder's geographic location and the time of year, and also records actual changes in electrical load measured periodically at a source over a time span such as a month. An additional analysis of active power against reactive power on the feeder is used to identify changes in load which were driven by real consumption versus those driven by changes in solar generation. A comparison of the actual changes in electrical load due to solar generation variation to the maximum irradiance curve yields a scaling factor and provides an estimate of the solar generation capacity on the feeder.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a technique for estimating solar generation capacity on a feeder in the electrical distribution grid is merely exemplary in nature, and is in no way intended to limit the disclosure or its applications or uses.

An electrical power grid consists of a transmission network and a distribution network. The transmission network handles the movement of electrical energy from a generating site, such as a power plant, to a voltage-reducing substation. The distribution network moves electrical energy on local wiring between substations and customers. The distribution portion of the grid may include customers with individual, small solar generation equipment. Because these small installations are typically not regulated or even recorded, the electrical utilities have no official data source indicating the total amount of solar generation capacity that exists.

Figure 1:
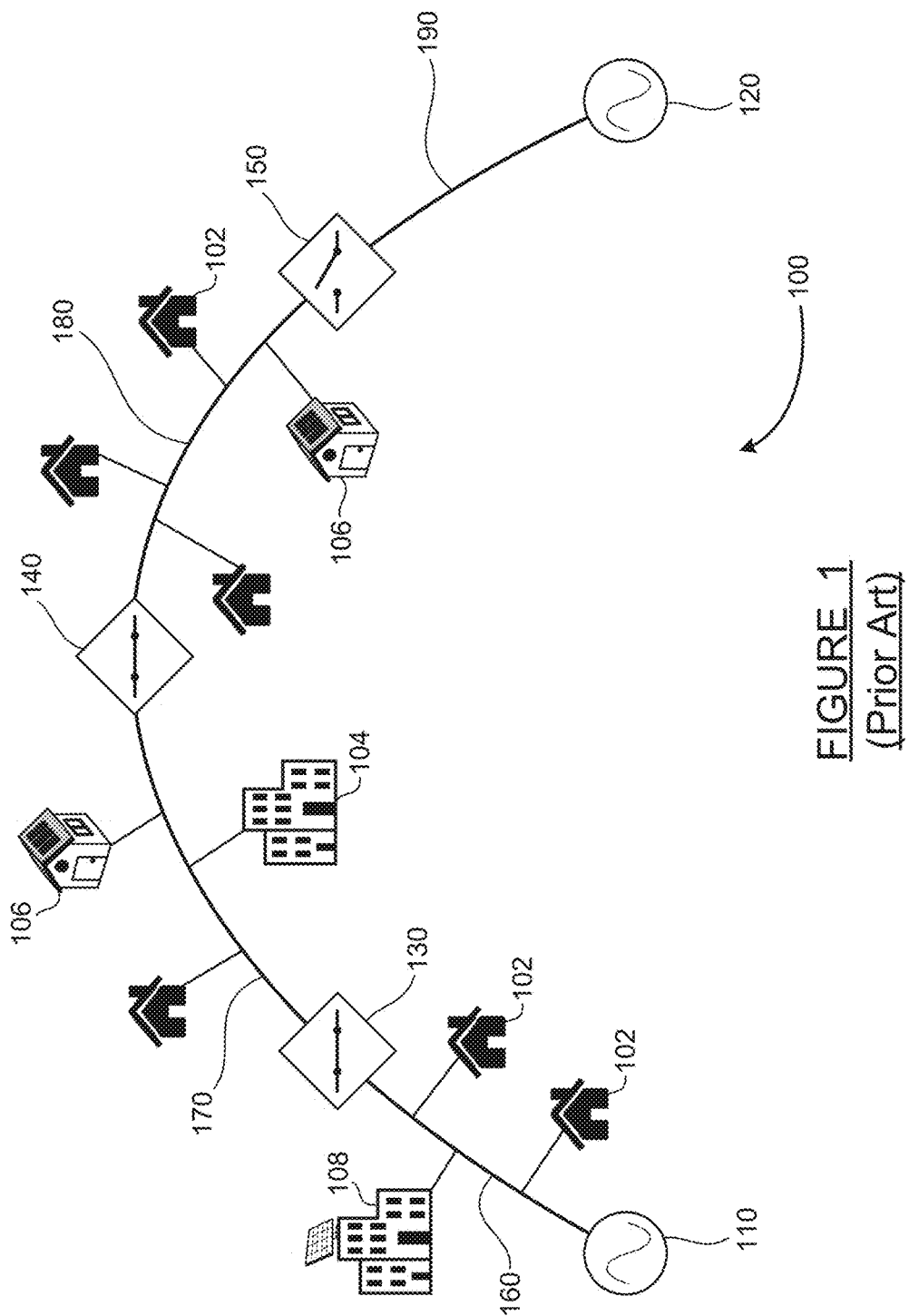
FIG. 1 is a schematic diagram of a typical feeder, or portion of the distribution grid, with distributed solar generation at some customers, as known in the art.

FIG. 1 is a schematic diagram of a typical feeder 100, or portion of the distribution grid, as known in the art. The feeder 100 provides electrical energy to many end customers, including houses 102 and businesses 104. The feeder 100 has a main source 110 at one end and an alternative source 120 at the other end. The sources 110 and 120 are typically substations, where high voltage energy (often several hundred thousand volts) on the transmission grid is transformed down to relatively low voltage energy (less than 30,000 volts), where it is carried on local power lines and further down-transformed for distribution to the customers. The main source 110 is normally connected to and provides the power to the feeder 100, while the alternative source 120 is normally disconnected from the feeder 100 by a switch 150.

Between the main source 110 and the alternative source 120, switches 130, 140 and 150 divide the feeder 100 into sections. A section 160 is located between the main source 110 and the switch 130, a section 170 is located between the switch 130 and the switch 140, and a section 180 is located between the switch 140 and the switch 150. The switches 130 and 140 are normally closed, so that the main source 110 provides power to the sections 160, 170 and 180 of the feeder 100. The switch 150 is normally open, with a section 190 between the alternative source 120 and the switch 150. The section 190 may or may not include any customer connections. For the purposes of this discussion, the section 190 is powered by the alternative source 120, regardless of whether the section 190 includes customer connections.

It is to be understood that the feeder 100 is a three-phase network. That is, each of the sections 160, 170 and 180 includes three lines ($L_1$, $L_2$, $L_3$), each 120° out of phase with the others. The houses 102 and the businesses 104 may receive service from one or more of the phases, where the houses 102 almost always have single-phase service, and the businesses 104 may have three-phase service if they have high energy demands and/or large inductive loads such as motors.

Some of the customers on the feeder 100 have installed local solar generation capability, typically a photovoltaic (PV) panel or a small array of PV panels. On the feeder 100, houses 106 and a business 108 are shown having solar panels. As discussed earlier, the solar panels at the houses 106 and the business 108 may be capable of providing most of all of the electrical power needed by the home or business at some times, and may even provide excess power back to the distribution grid under some circumstances. For example, on a sunny weekday when none of the residents are at home, the houses 106 may generate several kilowatts (kW) of surplus power which is available to go back onto the grid. Likewise for the business 108 on a sunny weekend day when the business 108 is closed. On the other hand, the houses 106 and the business 108 may have to buy all of their electrical energy from the utilities in other circumstances (i.e., when the sun is not shining).

The variability in power production discussed above makes it difficult to manage and operate a reliable grid where PV (solar generation) penetration is high. This is particularly true if the grid operators do not know the amount of solar generation capacity. In addition to the inherent variability in solar generation power production, which can cause rapid swings in the amount of power needed from traditional generation sources (natural gas and nuclear power plants, etc.), there are other factors which must be considered by grid operators when PV penetration is high. For example, when a fault appears on a system and causes the voltage to drop, solar generation devices will disconnect themselves. This can cause issues when the fault is isolated, and the system tries to reconnect portions of the grid. If the PV panels were supporting a large amount of the power being consumed before the fault, a much higher load will need to be supported (by traditional generation sources) during reconnection than what was seen before the fault occurred, because the PV panels are configured to remain disconnected for some period of time after grid power is restored. A large number of PV panels will also contribute to the fault current at the onset of the fault, which the protection settings must take into account to coordinate protection.

There are currently many techniques for estimating the output of PV panels, where the equipment nameplate rating is known, and many different measurements (irradiance measurement, cloud forecasts, satellite images, etc.) are included. Techniques such as these, however, are not feasible without a central point of computation, and they rely on a known amount of connected generation equipment. Unfortunately, the amount of connected generation capacity is generally not known, because of the rapid increase in the number of small, unreported PV installations.

The present disclosure provides a technique for estimating solar generation capacity in a portion of the distribution grid, using locally available measurements, without requiring knowledge of each individual installation. This scheme provides grid operators with a current, reliable estimate of PV penetration, which can be used to anticipate daily fluctuations in traditional power generation requirements, and to improve fault detection capability and service restoration plans.

In the disclosed method, the maximum theoretical solar irradiance for a particular geographic location and time of year is plotted. This yields a dome-shaped curve with irradiance beginning at sunrise, peaking at mid-day and ending at sunset. Actual deviations in load are measured for a feeder, such as at the substation source. The changes in load are measured at regular time intervals, such as every 15 minutes, over a period of many days. A comparison of active to reactive power on the feeder is used to eliminate load deviation points which are driven by a real change in demand as evidenced by an accompanying reactive power change. The remaining load deviation points are attributed to variations in solar generation, such as when heavy cloud cover appears or disappears. These load deviation points are then plotted, and the dome-shaped irradiance curve is scaled to fit the load deviation point data, where the scale factor indicates the solar generation capacity on the feeder.

Figure 2:
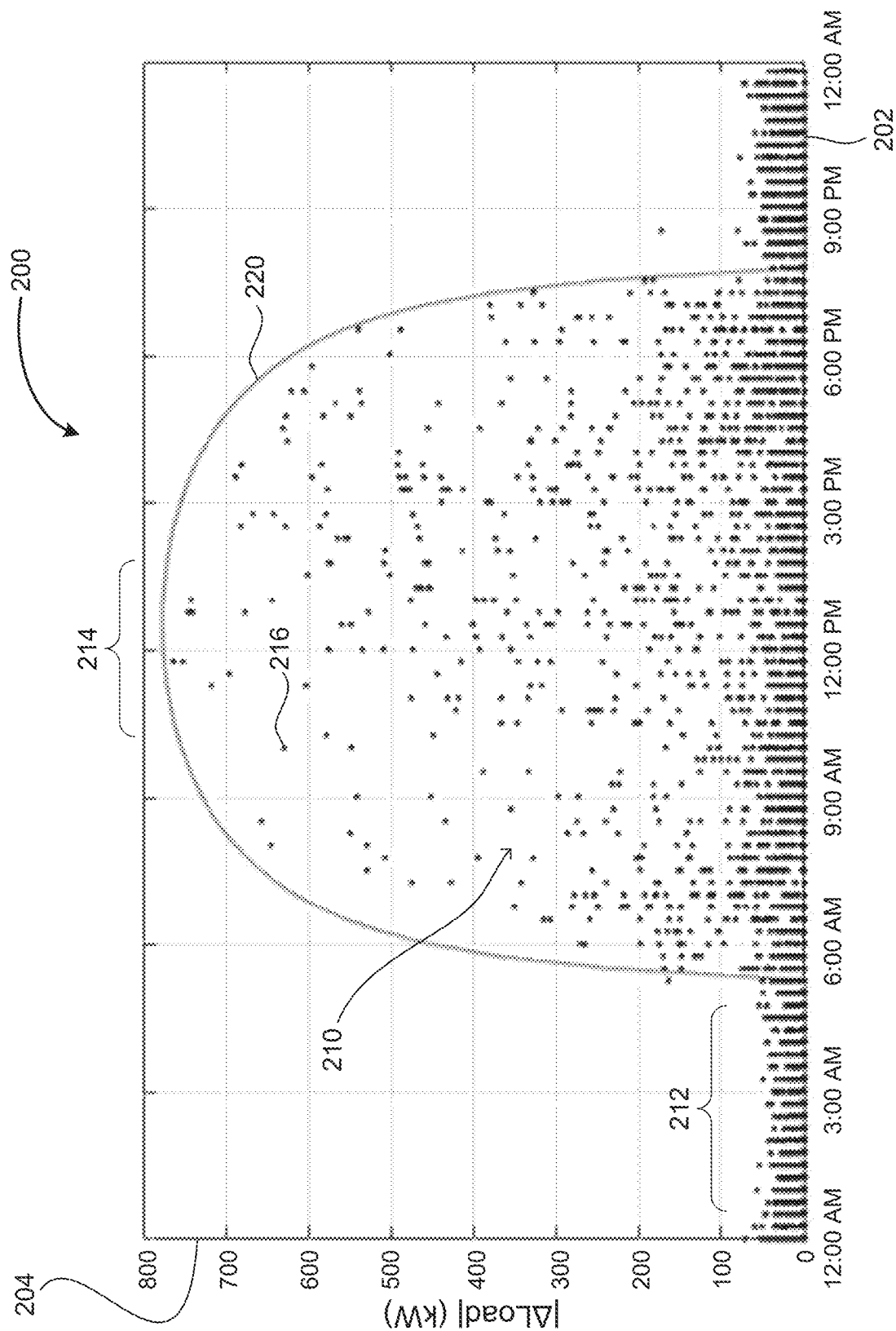
FIG. 2 is a graph of data points representing changes in load on a feeder versus time of day, over a period of a month, with a maximum solar irradiance curve fitted to the data points, according to an embodiment of the present disclosure.
Figure 3:
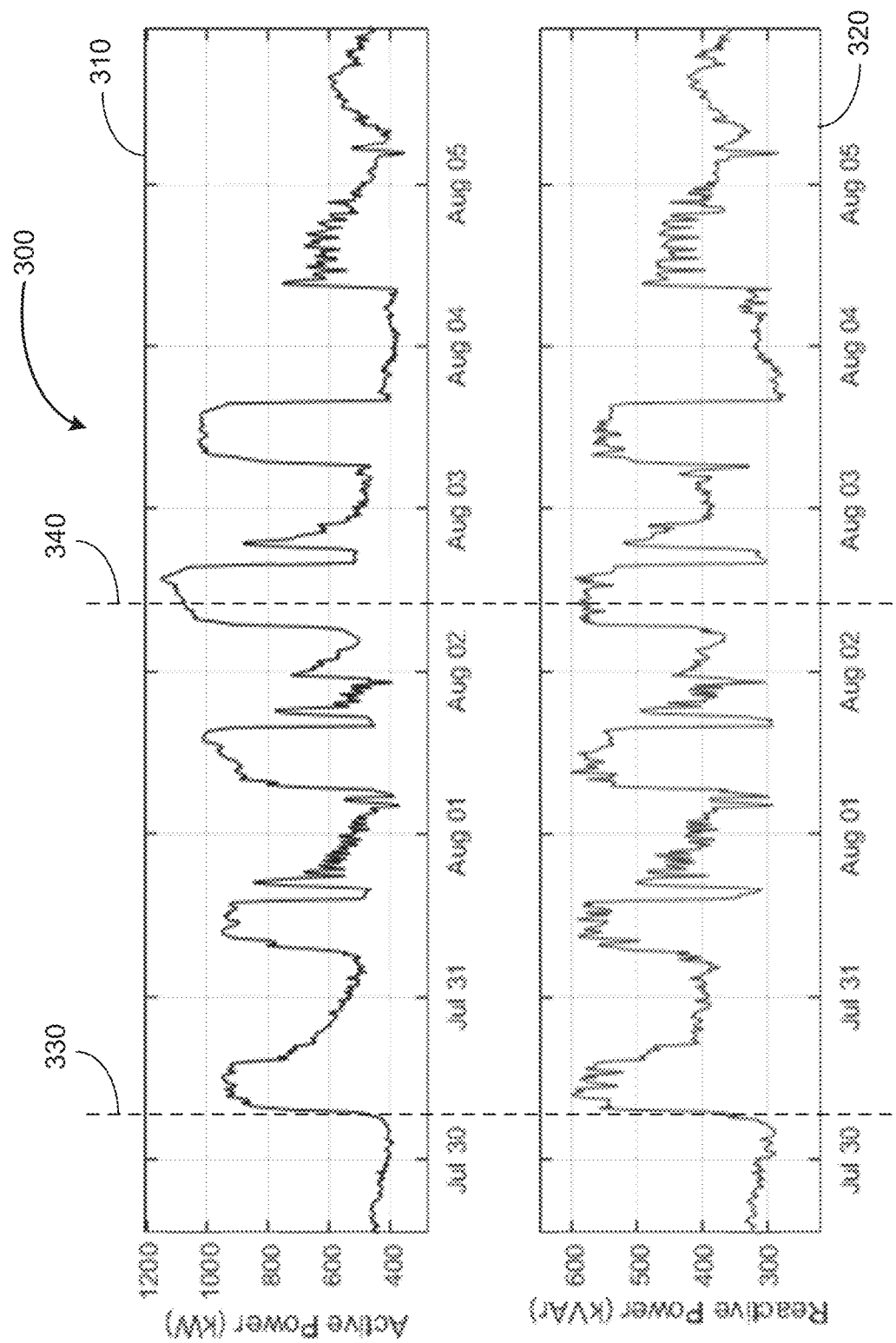
FIG. 3 is a paired graph of active power over reactive power on a feeder, used to distinguish real changes in consumer load demand from load changes driven by solar generation fluctuation, according to an embodiment of the present disclosure.
Figure 4:
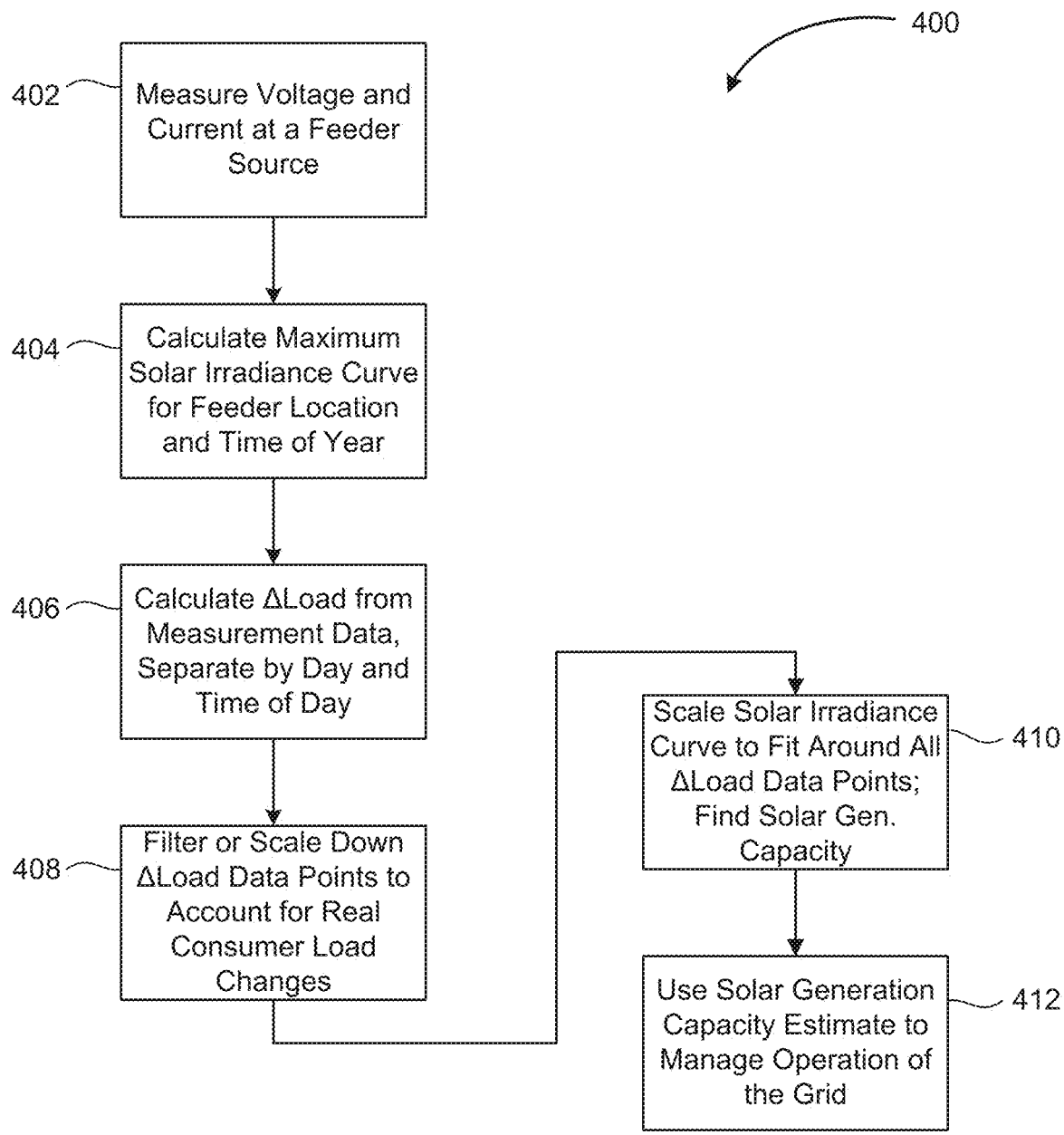
FIG. 4 is a flowchart diagram of a method for estimating solar generation capacity on a feeder, using the information contained in FIGS. 2 and 3, according to an embodiment of the present disclosure.

The following discussion of FIGS. 2-4 provides a detailed explanation and examples of the techniques for solar generation estimation described briefly above. Throughout this discussion, it should be understood that the total solar generation capacity estimate provided by the disclosed methods includes both small, private PV installations and large, monitored "solar panel farms".

The present disclosure describes methods for estimating the total solar generation capacity on a portion of the distribution grid, such as a feeder of the type shown in FIG. 1. The basic premise of the disclosed solar generation estimation technique is that, over the course of a few weeks of observation, alternating periods of cloudy and clear skies will cause many fluctuations in the amount of solar power being generated on the feeder, and this will result in fluctuations in the amount of power being drawn from a source such as the substation connecting the feeder to the transmission grid. This fluctuation data can be used along with other factors to calculate an estimate of the solar generation capacity on the feeder.

FIG. 2 is a graph 200 of data points representing changes in load on a feeder versus time of day, over a period of a month, with a maximum solar irradiance curve fitted to the data points, according to an embodiment of the present disclosure. On the graph 200, a horizontal axis 202 represents time of day, starting at midnight at the left and ending at the following midnight at the right. A vertical axis 204 represents absolute value of change in load (absolute value of ΔLoad), in kilowatts (kW). Load is the amount of power being provided to the feeder 100, measured at the source (substation) 110. This is calculated from voltage and current measurements by sensors at the source 110. Load data is measured and calculated at regular time intervals throughout the day, such as every 15 minutes. The difference in load from one measurement sample time (such as 2:45 pm) to the next measurement sample time (3:00 pm) is the ΔLoad data point for that time (3:00 pm) for that day. Absolute value of ΔLoad is plotted on FIG. 2.

Data points for a month are shown collectively at 210 in FIG. 2. That is, for each time interval (identifiable as vertical lines of points), one data point is plotted for each day in the month. More or less than one month's worth of data could be used, but it is recommended that at least ten days' worth of data be used in order to obtain the desired results. In the pre-dawn hours, shown at 212, the ΔLoad values are small, generally less than 50 kW. Of course, there is no solar generation (and therefore no fluctuation in solar generation) in the pre-dawn hours, so the ΔLoad values are attributable to real changes in consumer load demand, or to variation in other types of distributed generation such as wind energy. In the mid-day hours, shown at 214, the ΔLoad values are at their largest. As will be explained below, this can be attributed to rapid fluctuations in solar generation, and can be used to estimate solar generation capacity.

An individual data point 216 will be used as an example to further illustrate the concept. The data point 216 indicates a |ΔLoad| value of about 630 kW at the 10:00 am measurement for one of the days of the month. This means that the load demanded by the feeder 100 (equal to the power provided by the source 110) either increased or decreased by 630 kW between 9:45 and 10:00 am. If the load increased by 630 kW, this could be attributable to a large decrease in solar generation on the feeder (as would be caused by a sudden solid overcast cloud cover). Conversely, if the load decreased by 630 kW, this could be attributable to a large increase in distributed solar generation (as would be caused by rapidly clearing skies).

Another step of the disclosed methods is to calculate a maximum theoretical solar irradiance curve for the particular geographic location of the feeder. For all locations on earth except along the equator, the irradiance curve must be adjusted for the time of year. For example, in mid-latitudes of the northern hemisphere, the solar irradiance curve is much wider and much higher in June than it is in December, while above the arctic circle there is no solar irradiance at all for several months during the winter. The time-of-year-adjusted geographic solar irradiance is not aggregated to total energy over a whole day, but rather plotted as a power curve over the course of a day, indicating the maximum amount of solar irradiance power available (under clear skies), per unit of area, at each time of day. The solar irradiance power curve may be scaled in any suitable manner, such as solar power in kW per square meter of incident surface area.

On FIG. 2, a curve 220 is a maximum solar irradiance curve of the type described above, for the geographic location of the feeder and for the time of year corresponding to the data points 210. The curve 220 on FIG. 2 has been scaled to fit the ΔLoad data points 210, which will be discussed below.

As described above, the intention of the disclosed method is to use the ΔLoad data points 210 to estimate the total solar generation capacity on the feeder. Thus, only changes in load due to changes in solar generation are desirable to plot on FIG. 2. As is known in the art, there are other reasons for rapid changes in load throughout the day—in particular, actual customer demand for electrical power varies considerably throughout the day, often in a predictable and detectable manner. Thus, a technique is needed to filter out ΔLoad values which are attributable to actual changes in customer energy usage.

FIG. 3 is a paired graph 300 of active power over reactive power on a feeder, used to distinguish real changes in consumer load demand from load changes driven by solar generation fluctuation, according to an embodiment of the present disclosure. The paired graph 300 includes a graph 310 of active power in kW provided to the feeder 100, as measured at the source 110, over a period of seven days. The paired graph 300 also includes a graph 320 of reactive power in kVAr (kiloVolt-Amps reactive) provided to the feeder 100, as measured at the source 110, over the same seven days and on the same time scale. As is known in the art, reactive power exists in an AC circuit when the current and voltage are not in phase, a condition which is caused primarily by inductive loads.

In real world conditions, changes in consumer load (active power demand) are generally accompanied by changes in reactive power. This is because consumer energy consumption naturally includes a certain percentage of inductive loads—such as industrial motors for stamping machines in factories, compressor motors and blower motors for air conditioners in homes, etc. Conversely, solar (PV) generation provides pure active power (voltage and current in phase), with no reactive power. Thus, the graphs 310 and 320 can be analyzed to identify significant changes in active power which are accompanied by corresponding changes in reactive power, and those events can be attributed to actual consumer load changes, not changes in solar generation.

On the paired graph 300, a vertical line 330 designates a point in time on July 30, at about 6:00 am. At this time, a large increase in active power is apparent on the graph 310. This increase in power (i.e., ΔLoad) of about 500 kW happens in about 15-30 minutes. Thus, this is a large ΔLoad event, and would be a significant data point on FIG. 2. However, it can be seen on the graph 320 that there is a corresponding increase in reactive power at the same time. Therefore, most or all of the ΔLoad associated with the event at the line 330 can be attributed to actual consumer load (probably many factories and industrial facilities starting daily operations on a Monday morning), rather than to a sudden change in solar generation. For this reason, the data point at the line 330 would not be included on the graph of FIG. 2.

Conversely, a vertical line 340 designates a point in time on August 2, at about 10:00 am, when consumer load change is not indicated. At this time, a noticeable increase in active power is apparent on the graph 310, while it can be seen on the graph 320 that there is no change in reactive power at the same time. Therefore, most or all of the ΔLoad associated with the event at the line 340 can be attributed to a change in solar generation, rather than to a change in actual consumer load. For this reason, the data point at the line 340 would be included on the graph of FIG. 2.

The data from the graphs 310 and 320 can be used to filter or modify the data points 210 on FIG. 2 in any suitable manner, using the general concept of actual consumer load change discussed above. For example, if a 100% increase in active power at a sample time is accompanied by a 100% increase in reactive power at the same sample time, then the data point at that sample time can be completely disregarded (given a value of zero on FIG. 2). On the other hand, when an increase in active power occurs with no change in reactive power, the entire ΔLoad value can be attributed to solar generation variation.

The mathematical calculations associated with the examples cited above, which is merely one embodiment of a technique for compensating for real load changes, are shown below:

$$\Delta Load_{plot} = \Delta Load_{meas} - \Delta Active_{meas}\left(\frac{\Delta Reactive_{pct}}{\Delta Active_{pct}}\right) \quad (1)$$

Where $\Delta Load_{plot}$ is the Load value (data point) to plot on the graph 200 of FIG. 2, $\Delta Load_{meas}$ is the Load value measured and computed at the source 110 at the sample time as discussed above in relation to FIG. 2, $\Delta Active_{meas}$ is the actual change in active load at the source 110 at the sample time from FIG. 3, $\Delta Active_{pct}$ is the percent change in active power for the same sample time as shown on the graph 310, and $\Delta Reactive_{pct}$ is the percent change in reactive power for the same sample time as shown on the graph 320.

Equation (1) exhibits a behavior where, if active and reactive power both experience a proportional change at a sample time, then the factor in parenthesis will be approximately equal to 1, and the actual active power magnitude will be subtracted from the measured Load value. On the other hand, if reactive power change is zero, then the subtractive term is zero, and the measured Load value will be used without modification.

Another technique which could be used, as an alternative to the proportional modification of Equation (1), would be to simply disregard (not plot on FIG. 2) any data point which appears to be largely driven by actual changes in consumer load based on the graphs of FIG. 3. Still other approaches can be used for filtering or compensating the Load data points on FIG. 2, based on the active vs. reactive power graphs of FIG. 3. Regardless of the filtering/compensation approach used, by plotting about a month's worth of data on FIG. 2, it has been found that there are ample solar generation-driven Load events to draw the curve 220 with high confidence.

Returning to FIG. 2, the data points 210 are now filtered or compensated to represent solar generation-driven ΔLoad events only, as discussed above. For example, before filtering or compensation, the data points 210 would have included a very high ΔLoad data point at 6:00 am on at least one day. The only remaining step in the solar generation estimation process is to scale the curve 220 to fit the ΔLoad data points 210. As described above, the ΔLoad data points 210 and the maximum solar irradiance curve 220 are inherently on the same time scale (time of day), so no scaling of the curve 220 on the horizontal axis is necessary. On the vertical axis, the curve 220 simply needs to be scaled up from the baseline value (kW per m² of installed PV surface area) to meet or slightly exceed the maximum ΔLoad data point value on the graph 200. In the case of the data on FIG. 2, this maximum value is about 770 kW, at 11:45 am on one of the days of the month. Using the natural shape of the solar irradiance curve 220 and scaling it to a peak value of about 780 kW (approximately 1% higher than the highest data point), it can be seen that the curve 220 fits the data points 210 very well, with only a couple outlier points.

Consider an example where the solar irradiance curve 220 (before scaling) has a peak value at noon of 0.75 kW/m². In order to scale the curve 220 to fit the 780 kW maximum based on the data points 210, the vertical axis values of the curve 220 will need to be multiplied by 1040 (780/0.75). The peak noon-time value of the curve 220 represents the estimated total solar generation capacity on the feeder 100—about 780 kW in this example. In simple terms, this can be explained by looking at FIG. 2 and seeing that rapid, heavy cloud cover near mid-day caused the solar generation on the feeder to drop by almost 800 kW (or rapid clearing caused the solar generation to jump by almost 800 kW). The scale factor (1040) represents the estimated total installed PV surface area on the feeder 100.

In some instances, there may not be significantly high mid-day data points to define the scaling factor for the curve 220. But there should be sufficient points in the "shoulder" areas of the curve (7:00-10:00 am and 3:00-6:00 pm, for example) to define the scaling factor of the curve 220 to fit the data points 210. FIG. 2 illustrates the disclosed method visually and graphically, but it should be understood that the disclosed solar generation estimation can be performed numerically, without a person having to draw a graph, visually inspect the graph and scale the curve 220 to fit the data points 210.

It is worth noting again that the solar generation estimation technique discussed above is accomplished using only local current and voltage measurements at the feeder source 110, known solar irradiance data, and pre-defined logic for filtering and scaling the measured data. No central coordination of solar generation (PV) installations is required. The solar generation estimates for a particular feeder can be recorded and compared from month to month, with an expectation of seeing a slight increasing trend. The month to month comparison also makes it evident if a particular month yields an suspicious estimate—such as an abnormally low solar generation capacity estimate caused by a lack of varying cloud conditions during the mid-day hours.

FIG. 4 is a flowchart diagram of a method for estimating solar generation capacity on a feeder, using the information contained in FIGS. 2 and 3, according to an embodiment of the present disclosure. At box 402, voltage and current data are measured at a source to a feeder, such as the source (substation) 110 of the feeder 100. As discussed earlier, this data is measured at regular intervals (such as every 15 minutes) over an extended period of time (such as a month).

At box 404, a maximum solar irradiance curve is calculated for the geographic location of the feeder 100, and for the time of year corresponding to the measurement data from the box 402. The solar irradiance curve indicates solar irradiance power available on a unit basis (such as per m² of surface area) at different times throughout the day.

At box 406, the voltage and current measurement data for each sample time are converted to power (P=V*I), and the difference in power from one sample time to the next is computed as an absolute value of load change (|ΔLoad|). The load change data points are separated by day and arranged by time of day for analysis. The arrangement of the data points 210 for analysis was shown graphically in FIG. 2, but is preferably performed using numerical data arrays in a digital computer. Many days' worth of data points are preferably used in the data set, with 30 days or one month's worth of data points being a preferred embodiment.

At box 408, the ΔLoad data points are filtered or scaled down to account for real changes in consumer load/demand, as evidenced by the comparison of active power and reactive power on the feeder. As discussed above, the identification of real changes in consumer load can be used to filter out (eliminate) certain data points from the data set, or can be used to down-scale the values of certain data points in the data set. The result of the box 408 is a set of ΔLoad data points which represent solar generation variation.

At box 410, the solar irradiance curve from the box 404 is vertically scaled to fit the set of ΔLoad data points from the box 408. The y-axis value of the solar irradiance curve is scaled up so that the solar irradiance curve fits around all of the ΔLoad data points, within some tolerance or with some exceptions for outlier points. The estimate of total installed solar generation capacity on the feeder 100 is indicated by the peak value of the scaled solar irradiance curve. The estimate of total installed solar generation PV surface area is the scale factor used to fit the curve to the data in this step.

At box 412, the solar generation estimate for the feeder 100 (and for other feeders) is used to manage operation of the grid. This could include advance planning for, and recovery from, faults and service outages, where the PV penetration is a significant consideration. It could also include regulating or restricting future large PV panel installations on a feeder or portion of the distribution grid which already has a large PV penetration. Use of the solar generation estimate could even include real-time actions such as warming up generation capacity in anticipation of sudden heavy cloud cover, or changing the mix of generation types to provide reactive power needed to support PV-heavy portions of the distribution grid.

The solar generation estimates for each feeder are preferably recorded each month, and the trend analyzed, where the expectation would be to see a slight upward trend in solar generation capacity from month to month, and certainly a noticeable increase in solar generation capacity from year to year.

As will be well understood by those skilled in the art, the several and various steps and processes discussed herein to describe the disclosed methods may be referring to operations performed by a computer, a processor or other electronic calculating device that manipulate and/or transform data using electrical phenomenon. In particular, this refers to a computer used for the recording of the load change data points and manipulation of the data points based on active/reactive power changes, and the scaling of the irradiance curve to fit the points, as illustrated in FIGS. 2 and 3. Those processors and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media. Further, the computer which performs the calculations described above is understood to be in communication with the source/substation 110 so that the computer can receive the measurement data from sensors at the source, and the computer is also understood to be in communication with or able to send its output to a grid operations control center.

The disclosed methods for solar generation estimation provide a means for estimating distributed solar generation capacity on a feeder without requiring knowledge of each individual PV panel installation. With the estimation this method generates, more informed decisions can be made about expected load fluctuations along with fault protection and service restoration, allowing for more efficient operation of the distribution grid in the presence of distributed solar generation.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for estimating solar generation capacity in a distribution grid feeder, the method comprising:
    measuring voltage and current at a source to the feeder, at sample times spaced at a regular interval, for a time duration of ten or more days;
    computing, using a processor having a memory, a maximum solar irradiance curve applicable for a geographic location of the feeder and for a current time of year;
    calculating a change in load (ΔLoad) data point at each sample time, using the processor, from the measured voltage and current, where the ΔLoad data points are converted to absolute value;
    arranging all of the ΔLoad data points in a data array by time of day of the sample time;
    modifying the ΔLoad data points in the data array to eliminate changes in load caused by actual consumer power usage changes;
    scaling the maximum solar irradiance curve to fit the modified ΔLoad data points in the data array; and
    estimating the solar generation capacity in the feeder as a maximum value of the maximum solar irradiance curve after scaling.

2. The method according to claim 1 wherein the regular interval between the sample times at which the voltage and current data is measured is in a range of 10-30 minutes, inclusive.

3. The method according to claim 1 wherein the maximum solar irradiance curve defines a maximum solar irradiance power per unit area as a function of time of day, from sunrise to sunset.

4. The method according to claim 1 wherein calculating the ΔLoad data point at each sample time includes determining an absolute value of a difference between a load in the feeder at a current sample time and a load in the feeder at a previous sample time.

5. The method according to claim 1 wherein arranging the ΔLoad data points in the data array includes arranging the ΔLoad data points whereby each time of day in the data array includes one ΔLoad data point for each day in the ten or more days of the time duration.

6. The method according to claim 1 wherein modifying the ΔLoad data points in the data array includes eliminating any of the ΔLoad data points which have a sample time which corresponds with a simultaneous and proportional change in both active power and reactive power provided to the feeder by the source.

7. The method according to claim 1 wherein modifying the ΔLoad data points in the data array includes scaling down each of the ΔLoad data points by a factor which is determined by comparing a percent change in active power to a percent change in reactive power provided to the feeder at the sample time of each the ΔLoad data point.

8. The method according to claim 1 wherein the source to the feeder is a voltage-reducing substation connected to a power transmission grid.

9. The method according to claim 1 further comprising using the estimated solar generation capacity in the feeder for grid operational control.

10. The method according to claim 9 wherein using the estimated solar generation capacity in the feeder for grid operational control includes using the estimated solar generation capacity for one or more of; service restoration planning, rapid-response generation capacity planning, reactive power capacity planning, and real-time generator start-up or shut-down commands.

11. A method for estimating solar generation capacity in a distribution grid feeder, the method comprising:
   measuring voltage and current at a source to the feeder, at sample times spaced at a regular interval, for a time duration of ten or more days;
   computing, using a processor having a memory, a maximum solar irradiance curve applicable for a geographic location of the feeder and for a current time of year, where the maximum solar irradiance curve defines a maximum solar irradiance power per unit area as a function of time of day, from sunrise to sunset;
   calculating a change in load (ΔLoad) data point at each sample time, using the processor, from the measured voltage and current, where the ΔLoad data points calculated as an absolute value of a difference between load at a current sample time and load at an immediately previous sample time;
   arranging all of the ΔLoad data points in a data array by time of day of the sample time;
   modifying the ΔLoad data points in the data array to eliminate changes in load caused by actual consumer power usage changes, where the actual consumer power usage changes are indicated by a change in active power provided to the feeder accompanied by a coincident and proportional change in reactive power provided to the feeder;
   scaling the maximum solar irradiance curve to fit the modified ΔLoad data points in the data array;
   estimating the solar generation capacity in the feeder as a maximum value of the maximum solar irradiance curve after scaling; and
   using the estimated solar generation capacity in the feeder for grid operational control.

12. The method according to claim 11 wherein the regular interval between sample times is 15 minutes and the time duration is one month.

13. The method according to claim 12 wherein arranging the ΔLoad data points in the data array includes arranging the ΔLoad data points whereby each 15-minute interval in the data array includes one ΔLoad data point for each day in the month.

14. The method according to claim 11 wherein using the estimated solar generation capacity in the feeder for grid operational control includes using the estimated solar generation capacity for one or more of; service restoration planning, rapid-response generation capacity planning, reactive power capacity planning, and real-time generator start-up or shut-down commands.

15. A system for estimating solar generation capacity, the system comprising:
   a distribution grid feeder with a source providing power to the feeder, where the source includes sensors measuring voltage and current provided to the feeder; and
   a computer having a processor and memory, the computer being in communication with the source and receiving voltage and current data from the sensors,
   where the processor is configured with an algorithm performing steps of; computing a maximum solar irradiance curve applicable for a location of the feeder and a current time of year, calculating a change in load between a current sample time and a previous sample time, where the sample times are spaced at a regular interval and span a time duration of ten or more days, arranging each calculated change in load and its time of day as a data point in a data array, scaling the maximum solar irradiance curve to fit all of the data points, and estimating the solar generation capacity of the feeder based on the scaled maximum solar irradiance curve.

16. The system according to claim 15 wherein the regular interval between the sample times at which the voltage and current data is measured is in a range of 10-30 minutes, inclusive.

17. The system according to claim 15 wherein the maximum solar irradiance curve defines a maximum solar irradiance power per unit area as a function of time of day, from sunrise to sunset.

18. The system according to claim 15 wherein the algorithm further performs a step of modifying the data points in the data array to eliminate changes in load caused by actual consumer power usage changes, including eliminating or scaling down any of the data points which have a sample time which corresponds with a simultaneous and proportional change in both active power and reactive power provided to the feeder by the source.

19. The system according to claim 15 wherein the feeder is a portion of a power distribution grid and the source is a substation connected to a power transmission grid.

20. The system according to claim 15 further comprising a communication link from the computer to a grid control center which uses the estimated solar generation capacity in the feeder for grid operational control, including using the estimated solar generation capacity for one or more of; service restoration planning, rapid-response generation capacity planning, reactive power capacity planning, and real-time generator start-up or shut-down commands.

* * * * *